(12) United States Patent
Saeed

(10) Patent No.: US 10,690,381 B2
(45) Date of Patent: Jun. 23, 2020

(54) SOLAR TRACKING DEVICE

(71) Applicant: Elemental Engineering AG, Stans (CH)

(72) Inventor: Osman Saeed, Stans (CH)

(73) Assignee: Elemental Engineering AG, Stans (CH)

( * ) Notice: Subject to any disclaimer, the term of this patent is extended or adjusted under 35 U.S.C. 154(b) by 96 days.

(21) Appl. No.: 16/084,323

(22) PCT Filed: Mar. 22, 2017

(86) PCT No.: PCT/EP2017/056848
§ 371 (c)(1),
(2) Date: Sep. 12, 2018

(87) PCT Pub. No.: WO2017/162752
PCT Pub. Date: Sep. 28, 2017

(65) Prior Publication Data
US 2019/0078810 A1 Mar. 14, 2019

(30) Foreign Application Priority Data
Mar. 24, 2016 (GB) .................................. 1605082.5

(51) Int. Cl.
F24S 50/20 (2018.01)
G01S 3/786 (2006.01)
(Continued)

(52) U.S. Cl.
CPC ............. *F24S 50/20* (2018.05); *G01S 3/7861* (2013.01); *H01L 31/0547* (2014.12);
(Continued)

(58) Field of Classification Search
CPC .... H01L 31/054; H01L 31/0547; F24S 50/20; H02S 20/32; G01S 3/7861
(Continued)

(56) References Cited

U.S. PATENT DOCUMENTS 4,586,488 A    5/1986 Noto
7,847,182 B2 * 12/2010 Lin ........................ G01S 3/7861
                                                136/246
(Continued)

FOREIGN PATENT DOCUMENTS

CN    202210763 U     5/2012
JP    63-167212 U    10/1988
(Continued)

OTHER PUBLICATIONS

International Search Report of PCT/EP2017/056848 dated May 24, 2017 [PCT/ISA/210].
(Continued)

Primary Examiner — Kevin K Pyo
(74) Attorney, Agent, or Firm — Sughrue Mion, PLLC

(57) ABSTRACT

A solar tracking device having: a primary optical sensor (30); at least two auxiliary optical sensors (70a, 70b); and a housing. The housing has an upper surface (80) with a central hole (100; 62; 82) below which the primary sensor (30) is disposed and light wells (22; 25), disposed laterally around the central hole (100; 62; 82), in which each of the respective auxiliary sensors (70a, 70b) is disposed. Each light well (22; 25) has a bottom surface (15) on which the associated auxiliary sensor (70a, 70b) is disposed, an aperture (84) in the upper surface, and sidewalls (22) connecting the upper surface and the bottom surface. One of the sidewalls (22) is a light-reflective surface (25) disposed parallel to a tangent of the central hole, all other sidewalls being light-absorbing.

14 Claims, 6 Drawing Sheets

(51) Int. Cl.
*H01L 31/054* (2014.01)
*H02S 20/32* (2014.01)

(52) U.S. Cl.
CPC ........... *H02S 20/32* (2014.12); *F24S 2050/25* (2018.05); *Y02E 10/47* (2013.01)

(58) Field of Classification Search
USPC ..................................................... 250/203.4
See application file for complete search history.

(56) References Cited

U.S. PATENT DOCUMENTS

2009/0056700 A1   3/2009  Lin et al.
2015/0076319 A1   3/2015  Zhang

FOREIGN PATENT DOCUMENTS

| TW | 201 420 978 A | 6/2014 |
| WO | 2008/048478 A2 | 4/2008 |
| WO | 2015/107559 A1 | 7/2015 |

OTHER PUBLICATIONS

Written Opinion of PCT/EP2017/056848 dated May 24, 2017 [PCT/ISA/237].

\* cited by examiner

SOLAR TRACKING DEVICE

CROSS REFERENCE TO RELATED APPLICATIONS

This application is a National Stage of International Application No. PCT/EP2017/056848, filed Mar. 22, 2017, claiming priority based on British Patent Application No. 1605082.5, filed Mar. 24, 2016.

This invention relates to a solar tracking device, and in particular to a solar tracking device with multiple optical sensors.

BACKGROUND

In solar energy collection, it is desirable to position solar collection panels, such as photovoltaic (PV) panels, in an optimum orientation for the location. In fixed installations, this may be to position the panel facing in a generally southerly direction (in the northern hemisphere) and at a suitable angle to the horizon. However, such fixed installations do not capture as much of the sunlight as is possible, because the orientation is a compromise and for much of the day the sun will not be in an optimum position relative to the panel for efficient solar energy collection. To improve collection efficiency, it is known to provide solar panels with an associated solar tracking device that is able to sense the location of the sun relative to the panel and to orient the panel to point towards that direction with a motorised drive mechanism. In this manner, the panel can be oriented at the most efficient angle as possible at any given time of the day—typically, perpendicular to the sun.

It is known, for example from US 2015076319 A, to provide a solar tracking device comprising a box with a hole on the upper surface, a photosensitive element array on the bottom of the box and an array of convex lenses to direct incident sunlight on to the array. The device may include a motor to change the direction angle of a solar collection panel in response to signals from the photosensitive element array so as to maximise collection of solar energy at the panel.

WO 2015/107559 A1 shows a pointing sensor for solar tracking systems comprising image acquisition means, a shading sensor integral and aligned with said image acquisition means, a processing unit and a containing body opaque to light radiation, which forms the divider of the shading sensor.

US 2009/056700 A discloses a sun tracking system with a first and a second photo sensors, separately mounted on a solar panel on two positions apart from one another and symmetrical with respect to a center of the panel. A first sleeve surrounds the first photosensor; a second sleeve surrounds the second photosensor. Each of the sleeves has an inclined opening with reference to the surface of the panel.

CN 20 22 10 763 U shows a household sun-tracking photovoltaic power generation device. The device comprises an eight-point four-quadrant photoelectric sensor, a comparator, a stepping motor and a farad capacitor, wherein the photoelectric sensor is arranged on a metal pedestal of a wall body, two photoelectric sensors are arranged in upper and lower parts in each quadrant of the photoelectric sensor.

WO 2008/048478 discloses a sun sensor assembly having an aperture that defines an area that is less than the area of the photo-detecting surface of a corresponding photo-detector.

JP 2055736 Y, also known as JP 63 167 212 U1, discloses a 2×2 sensor assembly with associated apertures.

The present disclosure seeks to provide at least an alternative to solar tracker devices of the prior art.

BRIEF SUMMARY OF THE DISCLOSURE

In accordance with one aspect of the present invention there is provided a solar tracking device comprising: a primary optical sensor; at least two auxiliary optical sensors; and a housing. The housing has an upper surface with a central aperture below which the primary sensor is disposed and light wells, disposed laterally around the central aperture, in which each of the respective auxiliary sensors are disposed. Each light well comprises: a bottom surface on which the associated auxiliary sensor is disposed; an aperture in the upper surface; and sidewalls connecting the upper surface and the bottom surface. One of the sidewalls is a light-reflective surface disposed parallel to a tangent of the central aperture, all other sidewalls being light-absorbing.

The provision of the auxiliary sensors in their respective light wells with a single reflective surface means that by comparing signals output by the sensors it is possible to determine at least a rough indication of the position of the sun relative to the device. This can be useful as an input for positioning and orienting the device, for example as an initial input before the primary sensor is able to be used, allowing for a wider field of view. In one scenario, a field of view of the auxiliary sensors is wider than that of the primary sensor, so one or more of the auxiliary sensors may be triggered even if the primary sensor is not in a position to receive sunlight. Another advantage that the provision of the auxiliary sensors gives is redundancy: if the primary sensor fails, then the auxiliary sensors can take over as a de facto primary sensor.

Each light-reflective surface may be located on an outer sidewall, facing towards the central aperture. Alternatively, each light-reflective surface may be located on an inner sidewall, facing away from the central aperture.

The primary optical sensor may be a Position Sensitive Detector (PSD), which may be of the isotropic type that utilise photodiode surface resistance to indicate an optoelectric position or may comprise a 2D array of discrete sensors, such as CMOS, CCD or a Si diode array. PSDs can provide accurate position determination; generating signals indicative of where on the PSD light is incident, which can be used as input to reposition the device, for example with the objective of centring light on PSD, which in turn means the upper surface is perpendicular to the sun, being optimum for solar collection.

The solar tracking device may further include optics disposed between the central aperture and the PSD for focusing incident sunlight passing through the aperture on to the PSD. The solar tracking device may further comprise a mask with a central hole in registration between the lens and the central aperture.

The central aperture may be chamfered, widening towards the upper surface. The chamfered profile ensures that light from a wide range of angles can pass through the aperture. By way of example, the primary sensor may have a field of view (FOV) of approximately 175 degrees, in which case the aperture may be chamfered to ensure that light across that whole FOV can reach the sensor unimpeded.

Each auxiliary optical sensor may comprise a photodiode. In comparison to a PSD, photodiodes are simple and inexpensive. Also, the use of a different kind of optical sensor means that it is less likely that both types would fail, so providing redundancy to the system.

The light well apertures may be rectangular, with inner and outer sidewalls that are perpendicular to the upper surface, and with adjacent sidewalls that slope inwardly towards the bottom surface, forming generally trough-shaped light wells. This ensures that light from a wide range of angles can reach the auxiliary sensor at the bottom.

The solar tracking device may further comprise a chip operably connected with all of the optical sensors. The chip can process signals received from all of the sensors, and output signals indicative of, for example, the location and quantity of the incoming light. By having all of the sensors connected to a single chip, a physically close arrangement can be achieved, in turn resulting in optimised signal processing, less component calibration drift, and ensuring synchronised signals to the microcontroller.

The solar tracking device may further comprise at least one drive mechanism operable to position the device in response to detected light. Thus, dependent on the received input from the sensors, the device can be re-oriented for optimum light collection at any given time of day.

According to another aspect of the invention, there is provided a method of positioning a solar tracking device, comprising: providing a solar tracking device according to the first aspect, when including at least one drive mechanism operable to position the device in response to detected light; detecting at least one of: light intensity at the auxiliary sensors; and a position of incident light on the primary sensor; and actuating the at least one drive mechanism in response to the detected light with the objective of balancing the light intensity at the auxiliary sensors and centring the incident light on the primary sensor.

BRIEF DESCRIPTION OF THE DRAWINGS

Embodiments of the invention are further described hereinafter with reference to the accompanying drawings, in which.

DETAILED DESCRIPTION

Figure 9:
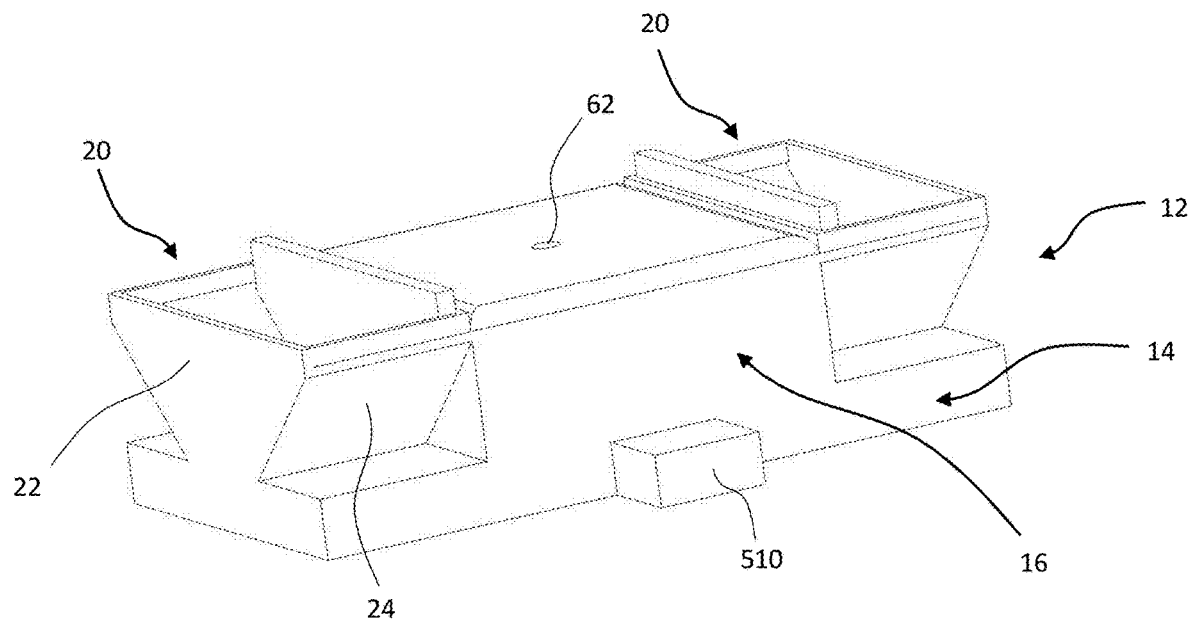
FIG. 9 is a perspective view of the housing with the upper plate removed, corresponding to FIG. 3 but at a shallower angle.
Figure 10:
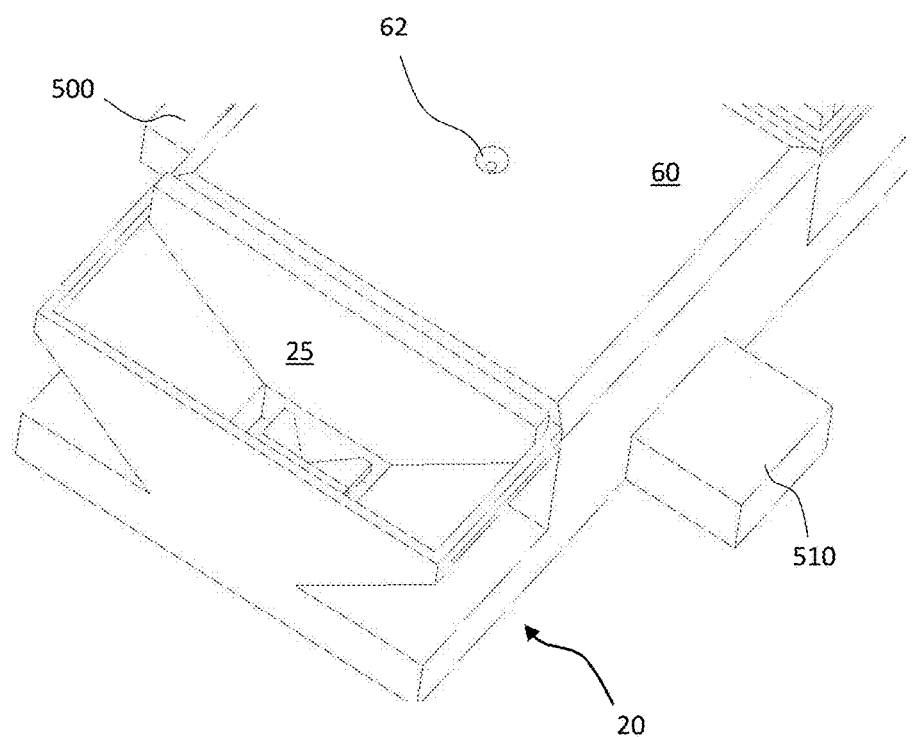
FIG. 10 is a further perspective view of the housing, corresponding to FIG. 9, but from a higher, wider angle.
Figure 11:
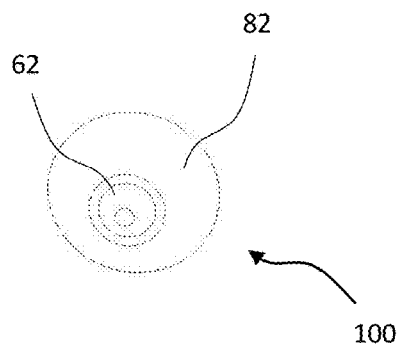
FIG. 11 is a detail perspective view from above of the central aperture in the upper plate and the underlying hole in the mask plate.

With reference to the accompanying drawings, an embodiment of a solar tracking device 10 is illustrated comprising a housing 12 as best seen in FIG. 9 made up of a generally rectangular base portion 14 with a base substrate 15, a generally square central portion 16 defining a hollow chamber 18 therewithin, and two lateral portions 20 on either side of the central portion 16 and over the base portion 14.

Figures 4, 5:
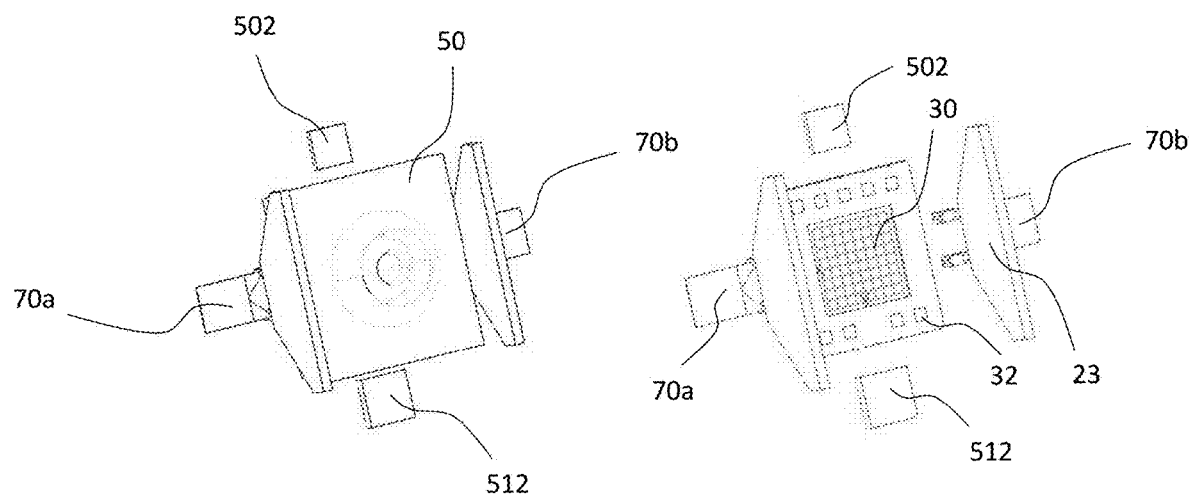
FIG. 4 is a top perspective detail view corresponding to FIG. 3 but with the mask plate removed to show an underlying lens, and with light well housings removed for clarity.
FIG. 5 corresponds to FIG. 4, but with the lens removed to show an underlying photosensitive element array together with a pair of adjacent optical sensors.
Figure 6:
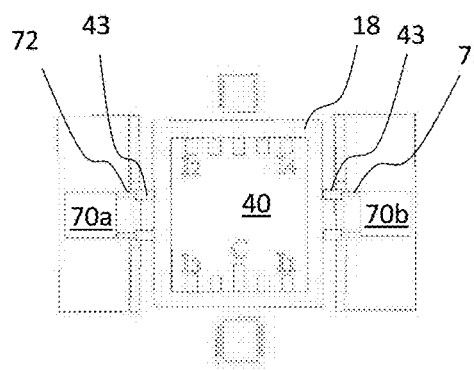
FIG. 6 is a plan view substantially corresponding to FIG. 5, but with the photosensitive element array removed to depict components of an underlying integrated chip (IC)
Figure 7:
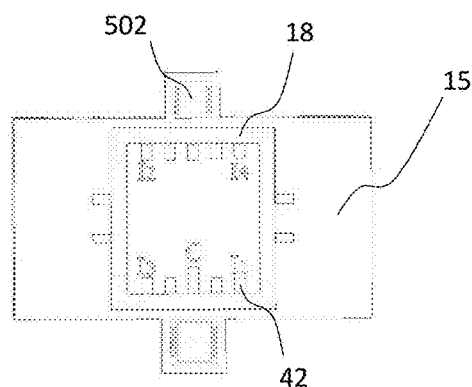
FIG. 7 corresponds to FIG. 6, but with the adjacent optical sensors removed, and showing an underlying substrate.
Figure 14:
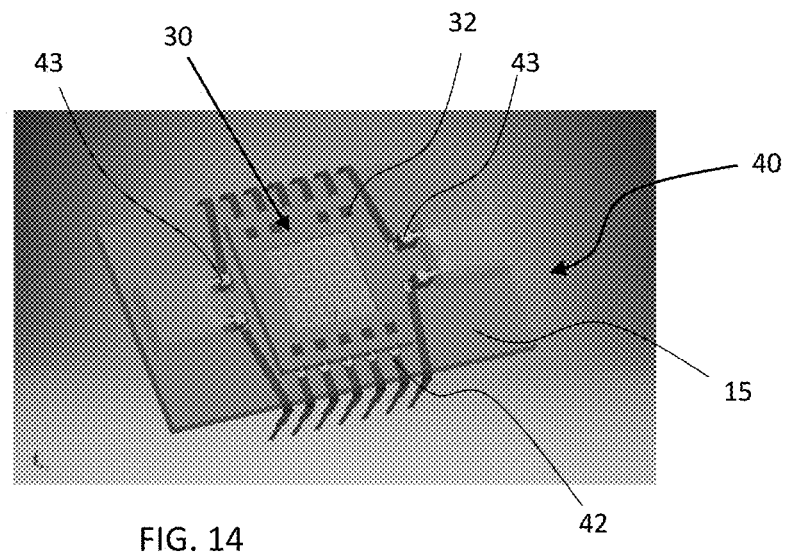
FIG. 14 is a top perspective view of an integrated circuit (IC) for use in the invention.

A Position Sensitive Device (PSD) 30 comprises a photosensitive element array and an associated microcontroller (not shown) and is housed within the hollow chamber 18, mounted in a plane parallel to the base substrate 15 directly on top of a processor in the form of an integrated circuit (or chip) (IC) 40. The microcontroller is typically located on a separate board from the photosensitive array so as to isolate those components. The PSD 30 is operatively connected to the IC 40 by way of mating contacts 32, 42 (FIGS. 5, 6 and 14). Optics, such as a lens 50, are mounted centrally above the PSD 30 for directing incident light on to the PSD as described more fully below. Above the lens 50 is a mask plate 60 with a chamfered aperture 62 that tapers from a relatively wide diameter to a relatively narrow diameter towards the underlying lens 50 and PSD 30. The mask plate 60 is parallel to the PSD 30, the IC 40 and the base substrate 15.

Figure 1:
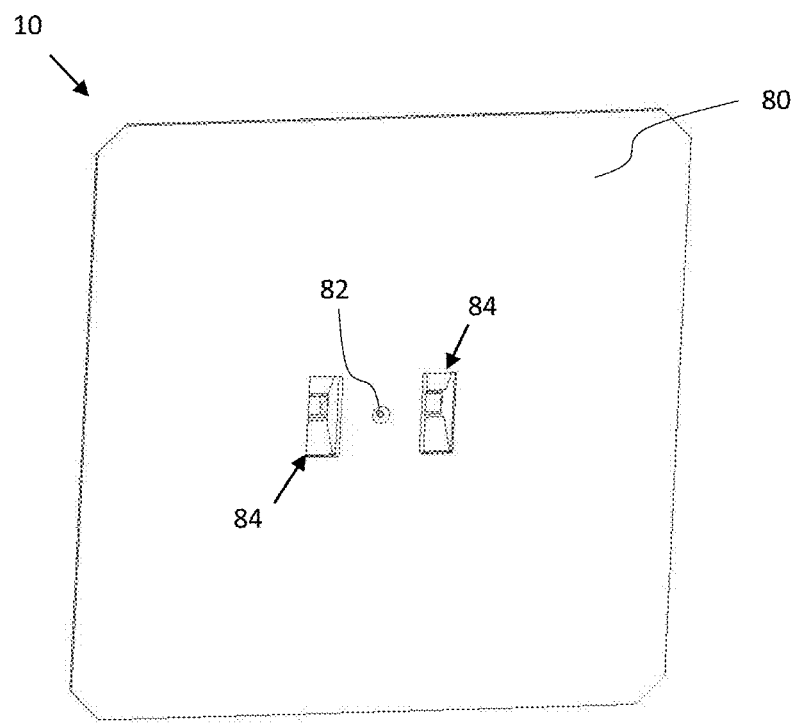
FIG. 1 is a view from above of a solar tracking device according to an embodiment.
Figure 2:
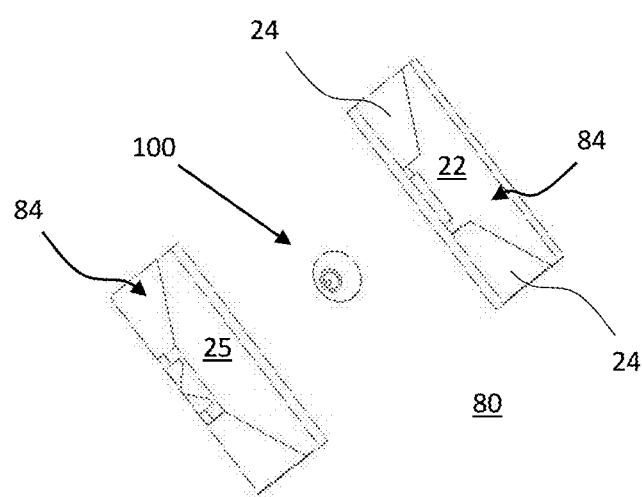
FIG. 2 is a detail view, showing apertures in an upper plate of a housing of the device.
Figure 3:
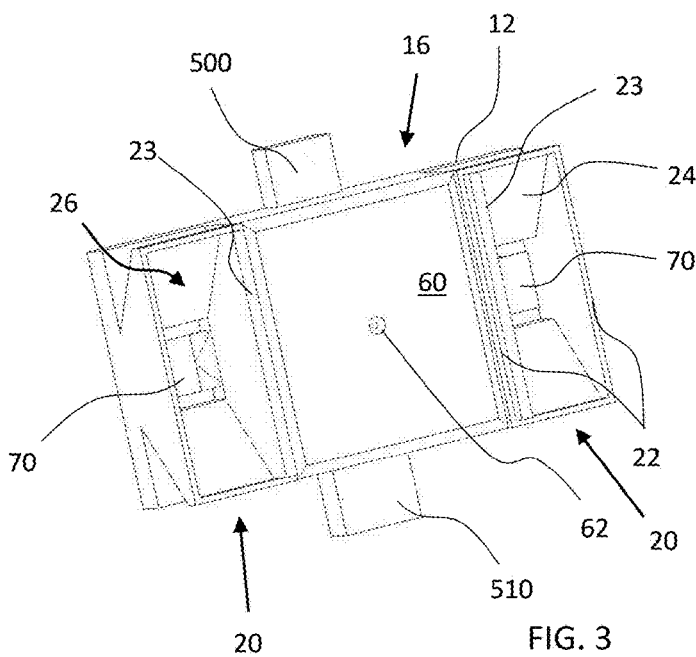
FIG. 3 is a top perspective view of the housing with the upper plate removed to show a mask plate with a central hole and a pair of light wells on either side.

As shown in FIGS. 1 and 8, an upper surface layer 80 of the housing is disposed above and parallel to the mask plate 60. The upper surface layer 80 includes a chamfered central hole 82 that that tapers from a relatively wide diameter to a relatively narrow diameter towards the underlying aperture 62 and is in registration with the central aperture 62 of the mask plate, thereby together forming an aperture 100 for light to pass from above the upper surface to the lens 50 below the mask plate 60. The lens 50 is designed to focus such incident light passing through the aperture on to the PSD 30.

The chamfering is provided to enlarge the effective range of angles at which incident light can pass through the top of the device to the PSD 30, but in certain embodiments, if either or both of the mask plate 60 and the upper surface layer 80 are thin enough, then it may not be necessary for the respective aperture 62 and hole 82 through them to be chamfered.

The lateral housing portions 20 each comprise parallel spaced-apart inner and outer sidewalls 22 that run perpendicular to the base substrate 15 and to the mask plate 60. Adjacent sidewalls 24 slope inwardly towards the base substrate 15, forming a generally trough-shaped light well with a relatively wide rectangular opening 26 at an upper end, transverse to the base portion 14, and a generally square opening 28 at a bottom end. The rectangular opening 26 may be defined by a corresponding rectangular aperture or hole 84 in the upper surface layer 80, in registration with the upper ends of the underlying sidewalls 22, 23, 24.

An optical sensor 70 is mounted at the bottom end of each light well, operatively connected to the IC 40 by mating contacts 72, 43. The optical sensor 70 can be any suitable electro-optical sensor, such as a photodiode. If the PSD 30 is considered as being the primary optical sensor for the device 10, then the optical sensors 70 can be considered as auxiliary optical sensors. In some embodiments, the auxiliary sensors 70 may generate simple binary signals indicative of light either reaching the sensor 70 or not. In other embodiments, the auxiliary sensors 70 may generate signals indicative of what quantity of light is reaching the sensor 70. In some embodiments, the sensors are able to detect light within the range: 300 nm to 1200 nm.

An insert 23 is mounted to the outer face of the inner sidewall 22 to provide a light-reflective surface 25 facing outwardly from the central portion 16. The inner surface of the outer sidewall 22, as well as the inner surfaces of the adjacent sidewalls 24 are all light-absorbent; especially black. In certain embodiments, the light-absorbency may be achieved by roughening the surface and/or by coating with a light-absorbing material. As such, only light entering the light well at a certain angle can fall on the sensor 70. From this and the fact that signals from both auxiliary sensors 70 are taken into account, it can be determined from the signals generated by the auxiliary sensors alone at least a rough indication of the position of the sun relative to the device 10. This is explained more fully by reference to the schematic ray diagrams of FIGS. 8a-c. In certain embodiments, rather than providing the reflective surface on an insert piece, it may be integral with the structure of the relevant sidewall.

Figure 8A:
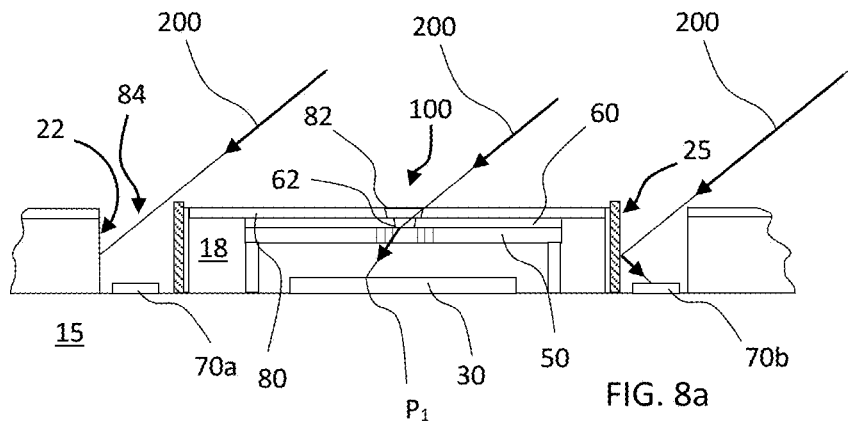
FIGS. 8a-c are schematic ray diagrams in cross-section through the device.

In FIG. 8a, the sun is to the right of the device as illustrated and as such parallel light rays 200 are incident on the device at an approximate 45 degree lateral angle. At this angle, some of the rays 200 can pass through the central aperture 100 to the underlying lens 50, where the rays are bent and focussed on to the PSD 30 at a point $P_1$. As seen in FIG. 5, the PSD 30 comprises a 2D array of sensors and the PSD will generate signals indicative of light being incident at point $P_1$ on the left side of the sensor array, which signals are processed in the microcontroller of the PSD 30, as explained below. Others of the parallel light rays 200 not blocked by the upper surface layer 80 can enter the light wells via the rectangular apertures 84. In the left-hand light well, as illustrated, the rays 200 at this angle strike the inner surface of the outer sidewall 22, where they are absorbed. Accordingly, no rays are able to reach the left-hand auxiliary sensor 70a and no signal will be generated by it. In the right-hand light well, the rays 200 at this angle strike the light-reflective surface 25 of the insert 23, where they are reflected and thus reach the right-hand auxiliary sensor 70b to trigger a signal indicative of the light having reached the sensor 70b.

Figure 8B:
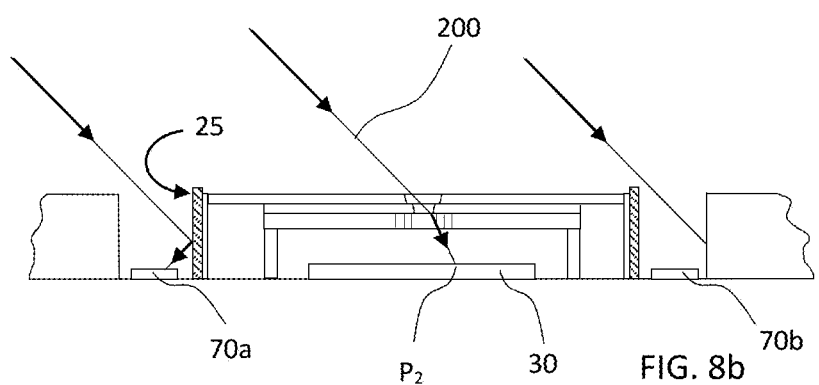

In FIG. 8b, the sun is on the opposite, left side of the device and hence the rays 200 are incident on the device at an approximate 45 degree lateral angle from the opposite sense to those in FIG. 8a. At this angle, some of the rays 200 can pass through the central aperture 100 to the underlying lens 50, where the rays are bent and focussed on to the PSD 30 at a point $P_2$ on the right side of the sensor array. The PSD will thus generate signals indicative of light being incident at point $P_2$, which signals are processed in the microcontroller of the PSD 30. Others of the parallel light rays 200 not blocked by the upper surface layer 80 can enter the light wells via the rectangular apertures 84. In the left-hand light well, as illustrated, the rays 200 at this angle strike the light-reflective surface 25 of the insert 23, where they are reflected and thus reach the left-hand auxiliary sensor 70a to trigger a signal indicative of the light having reached the sensor 70a. In the right-hand light well, the rays 200 at this angle strike the inner surface of the outer sidewall 22, where they are absorbed. Accordingly, no rays are able to reach the right-hand auxiliary sensor 70b and no signal will be generated by it.

Figure 8C:
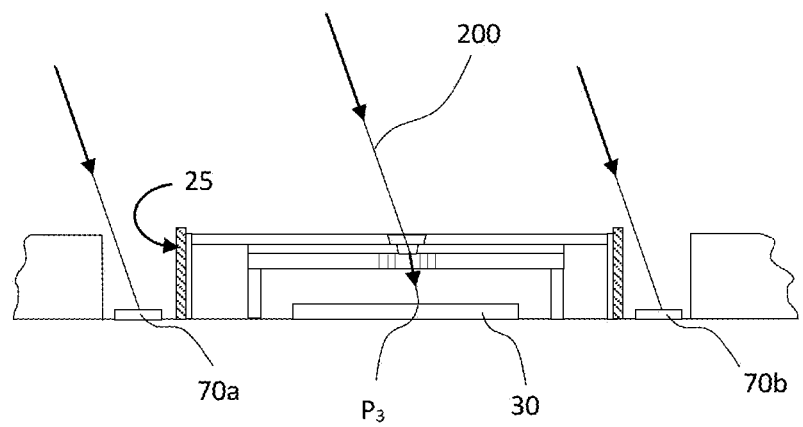

In each of FIGS. 8a and 8b the rays 200 are not able to reach the auxiliary sensors 70 directly because of the angle of the rays 200 and because of the masking effect of the upper surface 80. FIG. 8c illustrates a situation where the light rays 200 are steeper, incident on the device at an approximate lateral angle of 10 degrees from perpendicular to the surface 80. In this scenario, the rays 200 can reach the auxiliary sensors 70a, b directly, and both will therefore generate signals. Also, at this angle, some of the rays 200 can pass through the central aperture 100 to the underlying lens 50, where the rays are bent and focussed on to the PSD 30 at a point $P_3$ on the right side of the sensor array, but more centrally than point $P_2$ due to the steeper angle of incidence. The PSD will thus generate signals indicative of light being incident at point $P_3$, which signals are processed in the microcontroller of the PSD 30.

Because it is known that only light from the right-hand side of the device at a certain range of angles will generate signals at the right-hand auxiliary sensor 70b and that only light from the left-hand side of the device at a certain range of angles will generate signals at the left-hand auxiliary sensor 70a, if only one of the auxiliary sensors 70a, b is triggered then it can be determined from which side of the device the light is coming. Where both auxiliary sensors 70 are triggered, this is indicative of the incident light being at a steep enough angle relative to the device such that the light can reach the auxiliary sensors 70a, b directly. Because both auxiliary sensors are triggered, this may not provide an indication of whether the light source (typically the sun) is to the right or the left of the device as illustrated, just that it is within a specific range of angles. Thus, a rough determination of the relative location of the sun can be determined from the signals generated by the auxiliary sensors 70 alone.

To then obtain a more accurate determination of the relative position of the sun, the position of the point $P_{1-3}$ on the photosensitive array of the PSD 30 can be taken into account also. The array is divided into x and y coordinates and light incident on the array generates signals that can be analysed by the associated microcontroller to determine light triangulation in relative terms. Where the auxiliary sensors 70 are able to detect the quantity of light reaching them, the relative quantities reaching the different auxiliary sensors 70 can be used as additional input to determine the relative position of the sun.

A wide field of view (FOV) is desirable, because it allows for the device to function in a greater range of positions—particularly in a start-up mode where the position of the sun is as-yet unknown. By way of example, the PSD 30 may have a FOV of approximately 175 degrees. By coupling this with the auxiliary sensors 70, the FOV can be extended to approximately 270 degrees. More than one device 10 may be used in combination, for example by connecting two similar devices together, so as to provide a wider FOV.

Figure 12:
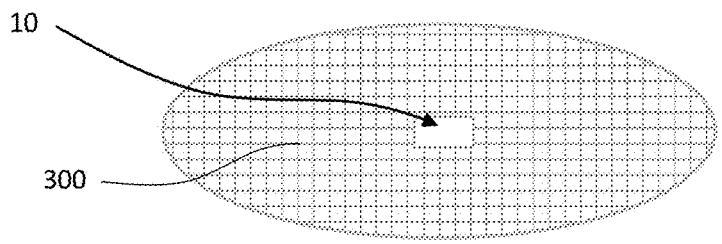
FIG. 12 is a schematic view of a solar tracking device incorporated into a solar panel.
Figure 13:
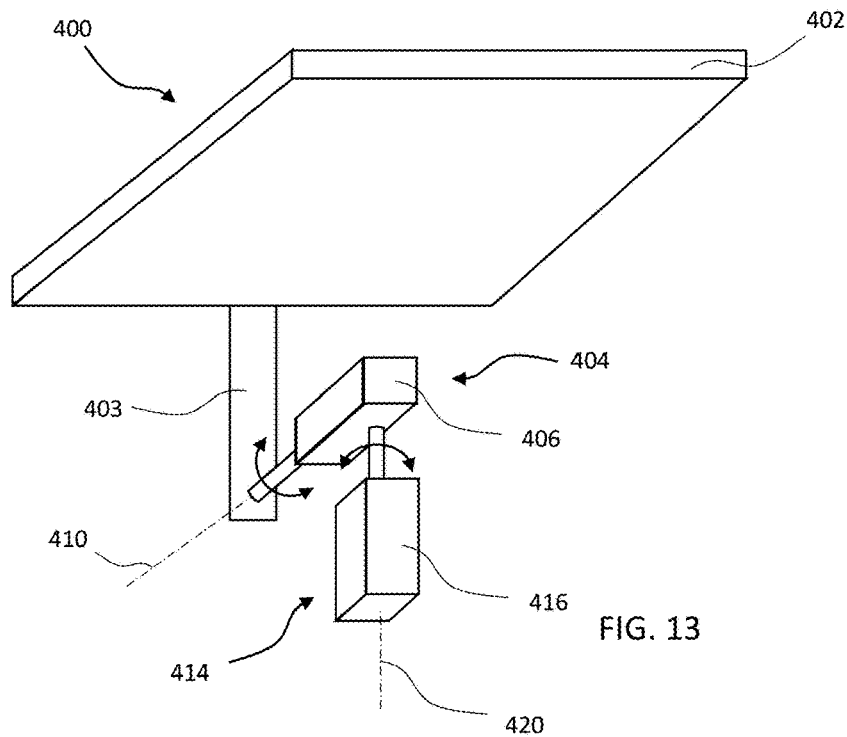
FIG. 13 is a schematic perspective view from below of a mechanism for rotating and tilting the solar tracking device and solar panel.

As shown in FIG. 12, the tracker device 10 may be incorporated into a solar collection device, such as a photovoltaic panel 300, with the upper surface 80 parallel to the panel 300, typically co-planar therewith. As is well known in the art, solar energy collection is maximised if the panel 300 is oriented in a plane perpendicular to the sun's rays. Thus, an objective of the device is to position the device relative to the sun so that the incident sunlight is as close to perpendicular to the upper surface 80 as possible. To this end, the device 10 and associated panel 300 may be mounted on a drive mechanism 400, as shown schematically in FIG. 13. In one embodiment, the drive mechanism 400 comprises a platform 402 on the upper surface of which the tracking device 10 may be mounted. An arm 403 projects from the underside of the platform 402. The platform 402 is operably connected to a first mechanism 404 for adjusting the tilt of the platform 402, here illustrated as a first drive motor 406 actuatable to rotate the arm 403 and therefore the platform 402 about a horizontal axis 410. The platform 402 is further operably connected to a second mechanism 414 for adjusting the rotational position of the platform 402. As illustrated, the second mechanism 414 comprises a second drive motor 416 actuatable to rotate the first mechanism 404 and therefore the platform 402 about a vertical axis 420.

In operation, the IC 40 will process signals received from the PSD 30 and from the auxiliary sensors 70 and thereby make a determination of the position of the sun relative to the device 10. The IC 40 is operable to transmit drive signals to the drive mechanism to actuate the first and second drive motors 406, 416 as necessary to orient the device 10 and thus the solar panel 300 as close as possible to perpendicular to the incident sunlight. In the first instance, taking just the input from the auxiliary sensors 70, the objective of the IC 40 would be to move the device to an orientation at which both of the auxiliary sensors 70 are triggered, being indicative of the panel 300 facing the correct general direction. The processing required to achieve this can be relatively simple, and optionally heuristic. In embodiments where the auxiliary sensors 70 can detect the quantity of incident light, then the objective would be to equalise the quantities detected at each auxiliary sensor 70. Once that initial positioning has taken place, or simultaneously therewith, the IC 40 additionally takes input from the (microcontroller of the) PSD 30 for more precise positioning.

Where the device 10 can be oriented in this manner, the effective FOV of the combined sensors 30, 70 is increased, and can provide up to full 360 degree coverage in each axis.

It will be appreciated that other drive mechanisms can readily be implemented for positioning the device 10 about a vertical axis (i.e. 'turn') and a horizontal axis (i.e. 'tilt') under feedback control from the optical sensors 30,70 and, optionally, from additional input.

It will be appreciated that a greater number of auxiliary optical sensors 70 may be provided, in respective light wells spaced around the central aperture 100. Signals from more than two auxiliary sensors might be interpolated to provide a more accurate initial determination of the relative position of the sun. By way of example, three auxiliary sensors may me positioned about the primary sensor in 120 degree spacings. The configuration of each light well might be adapted for its specific location on the device in such an arrangement. For example, the reflective surfaces 25 could all be aligned to face radially away from the central aperture 100. Alternatively, they might all be aligned in a common direction or be in facing pairs (i.e. with the reflective surfaces 25 located on the inner face of the outer sidewall 22 and facing inwardly towards the central aperture 100).

Figure 15:
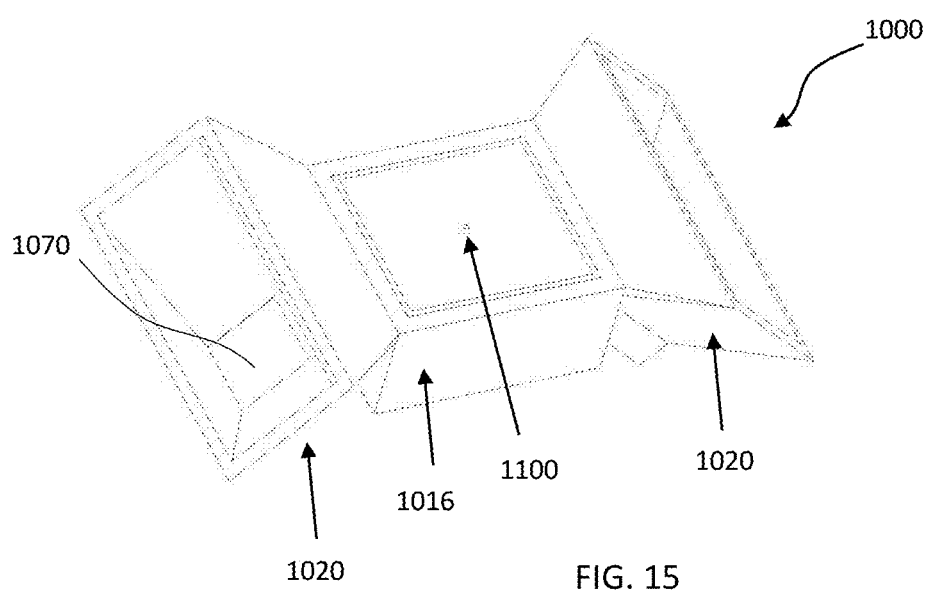
FIG. 15 is a perspective view of an alternative embodiment in which the auxiliary sensors.

In another embodiment, illustrated in FIG. 15, the auxiliary sensors 70 may be housed in respective lateral housings 1020 that are angled outwardly relative to an axis through the aperture 1100 in the central portion 1016. In this manner, light from a wider range of angles (i.e. a wider field of view) can be incident on the light-sensitive surface at least one of the sensors 1070 or the PSD.

The auxiliary sensors 70, 1070 can be simpler and less sensitive than the primary sensor 30 since they are generally operating as additional input to the system, although in certain circumstances—such as failure of the PSD, or in a wake-up mode—they could be acting together as the primary optical sensor for orienting the device 10.

In addition to the optical sensors 30, 70, the device can include one or more further sensors to provide additional input to the IC 40. In the embodiment illustrated, the housing 12 further includes a magnetometer module 500 in which is mounted a magnetometer chip 502 operably connected to the IC 40 for providing signals indicative of an orientation of the device relative to magnetic North. The housing 12 also further includes an inclinometer module 510 in which is mounted an inclinometer chip 512 operably connected to the IC 40 for providing signals indicative of an inclination of the device. The additional information provided by the signals from the magnetometer chip 502 and the inclinometer chip 512 can be processed by the IC chip 40 to give extra indications as to the position and orientation of the device relative to an expected position of the sun.

By way of example, the IC 40 could process the input from the magnetometer chip 502 in conjunction with a clock signal and, optionally, a location signal (such as from a GSM chip—not shown, or as manually input on installation) to provide an indication of an expected location of the sun relative to the device at a particular time and location, and can actuate the drive mechanism 400 to position the device to an appropriate orientation for the panel 300 to collect the solar energy and for the sunlight to reach at least one of the optical sensors 30, 70 so that they can generate input signals for the IC 40 to more accurately position the device.

The additional input from the inclinometer chip 512 can be used to compensate for a non-level installation of the device. Thus, it may not be necessary to set the device up perfectly horizontally for optimum operation.

The IC 40, the magnetometer module 500 and the inclinometer module 510 are all mounted on the substrate 15, which may comprise the substrate of a PCB. Instead of or as well as separate magnetometer and inclinometer modules 500, 510, a gyroscopic module (not shown) may be provided.

Instead of having the reflective surfaces on respective outer faces of the inner sidewalls 22, the reflective surfaces 25 may be located on the inner faces of the outer sidewalls (i.e. facing one another rather than facing away from one another), with suitable adaptation of the processing of the resultant signals. Whichever of these arrangements is used, the reflective surfaces of the respective light wells will preferably be aligned parallel to a tangent of the central aperture, so that the arrangement is rotationally symmetrical about the central aperture 100. The symmetrical arrangement simplifies the processing required on the signals received from the optical sensors 30, 70.

The input from the various sensors 30, 70 and modules 500, 510 can be used on initial installation to determine the location and orientation of the device 10. In theory, once that is known, the tracking of the sun could be achieved by reference to look-up tables populated with the sun's movement at that location and for a given time of day and year. However, live tracking can be achieved by taking the input from the sensors 30, 70 at suitable intervals. By way of example, a reading could be taken every four minutes or every 10 minutes. The frequency may depend on the light conditions. For example, in lower light conditions, the intervals may be longer than in brighter conditions.

At the start of each day (i.e. sunrise for the location of the device) the device may be programmed to revert to the previous day's starting orientation to increase the likelihood of sunlight being detected by the sensors 30, 70. If none of the sensors are triggered (for example when overcast), then the device can be programmed to perform random movements at suitable intervals until light is detected by at least one of the sensors 30, 70.

Although the invention has been described largely in the context of photovoltaic panels as the means for solar energy collection, it will be understood that it may be applied equally to other forms of solar energy collection and conversion, such as solar thermal collectors or solar concentration systems.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A solar tracking device comprising:
   a primary optical sensor;
   at least two auxiliary optical sensors; and
   a housing, having an upper surface with a central hole below which the primary sensor is disposed and light wells, disposed laterally around the central hole, in which each of the respective auxiliary sensors are disposed,
   wherein each light well comprises:
      a bottom surface on which the associated auxiliary sensor is disposed,
      an aperture in the upper surface, and
      sidewalls connecting the upper surface and the bottom surface,
   wherein one of the sidewalls is a light-reflective surface disposed parallel to a tangent of or being perpendicular to a radial connection to the central hole, all other sidewalls being light-absorbing.

2. The solar tracking device of claim 1, wherein each light-reflective surface is located on an outer sidewall, facing towards the central hole.

3. The solar tracking device of claim 1, wherein each light-reflective surface is located on an inner sidewall, facing away from the central hole.

4. The solar tracking device of claim 1, wherein the primary optical sensor is a position sensitive device (PSD).

5. The solar tracking device of claim 4, wherein PSD is isotropic.

6. The solar tracking device of claim 4, wherein PSD comprises a 2D array of discrete sensors.

7. The solar tracking device of claim 1, further including optics disposed between the central hole and the PSD for focusing incident sunlight passing through the central hole on to the PSD.

8. The solar tracking device of claim 7, further comprising a mask with an aperture in registration between the lens and the central hole of the upper surface.

9. The solar tracking device of claim 1, wherein the central hole is chamfered, widening towards the upper surface.

10. The solar tracking device of claim 1, wherein each auxiliary optical sensor comprises a photodiode.

11. The solar tracking device of claim 1, wherein the light well apertures are rectangular, with inner and outer sidewalls that are perpendicular to the upper surface, and with adjacent sidewalls that slope inwardly towards the bottom surface, forming generally trough-shaped light wells.

12. The solar tracking device of claim 1, further comprising a processor operably connected with all of the optical sensors.

13. The solar tracking device of claim 1, further comprising at least one drive mechanism operable to position the device in response to detected light.

14. A method of positioning a solar tracking device, comprising:
   providing a solar tracking device according to claim 13;
   detecting at least one of:
      light intensity at the auxiliary sensors; and
      a position of incident light on the primary sensor; and
   actuating the at least one drive mechanism in response to the detected light with the objective of balancing the light intensity at the auxiliary sensors and centring the incident light on the primary sensor.

* * * * *